(12) United States Patent
Mutter et al.

(10) Patent No.: US 11,585,834 B2
(45) Date of Patent: Feb. 21, 2023

(54) CIRCUIT FOR A BUS SYSTEM AND METHOD FOR OPERATING A CIRCUIT

(71) Applicant: Robert Bosch GmbH, Stuttgart (DE)

(72) Inventors: Arthur Mutter, Neuhausen (DE); Steffen Walker, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 135 days.

(21) Appl. No.: 16/981,163

(22) PCT Filed: Mar. 21, 2019

(86) PCT No.: PCT/EP2019/057114
§ 371 (c)(1),
(2) Date: Sep. 15, 2020

(87) PCT Pub. No.: WO2019/192851
PCT Pub. Date: Oct. 10, 2019

(65) Prior Publication Data
US 2021/0063444 A1 Mar. 4, 2021

(30) Foreign Application Priority Data
Apr. 6, 2018 (DE) .......................... 102018205217.4

(51) Int. Cl.
*G01R 1/20* (2006.01)
*H04L 12/40* (2006.01)
*H04L 25/12* (2006.01)

(52) U.S. Cl.
CPC ........ *G01R 1/203* (2013.01); *H04L 12/40006* (2013.01); *H04L 25/12* (2013.01)

(58) Field of Classification Search
CPC ... G01R 1/203; H04L 12/40006; H04L 25/12; H04L 2012/40215
USPC .......................................................... 326/30
See application file for complete search history.

(56) References Cited

U.S. PATENT DOCUMENTS

| | | | | |
|---|---|---|---|---|
| 5,977,797 | A * | 11/1999 | Gasparik | G06F 13/4072 326/86 |
| 6,124,727 | A * | 9/2000 | Bridgewater, Jr. | H04L 25/0272 326/86 |
| 2002/0114146 | A1 | 8/2002 | Bergman et al. | |
| 2003/0234663 | A1* | 12/2003 | Aloisi | H04L 25/0298 326/30 |

(Continued)

FOREIGN PATENT DOCUMENTS

| | | |
|---|---|---|
| CN | 101521638 A | 9/2009 |
| CN | 102087638 A | 6/2011 |

(Continued)

OTHER PUBLICATIONS

International Search Report for PCT/EP2019/057114, dated May 21, 2019.

*Primary Examiner* — Seokjin Kim
(74) *Attorney, Agent, or Firm* — Norton Rose Fulbright US LLP; Gerard Messina

(57) ABSTRACT

A circuit for a bus system. The circuit includes: a measuring circuit, which is configured to measure a first resistance value between two bus-side terminals of the circuit; an ascertainment circuit, which is configured to ascertain a second resistance value as a function of the first resistance value; and a resistive circuit, which is configured to set a resistor connectable between the two bus-side terminals to the second resistance value.

5 Claims, 3 Drawing Sheets

(56) References Cited

U.S. PATENT DOCUMENTS

| | | | |
|---|---|---|---|
| 2005/0285621 A1* | 12/2005 | Chen | H04L 25/0278 |
| | | | 326/30 |
| 2010/0177829 A1 | 7/2010 | Suzuki et al. | |
| 2013/0322463 A1 | 12/2013 | Hartwich et al. | |
| 2015/0149671 A1* | 5/2015 | Rohr | G06F 13/4072 |
| | | | 710/106 |
| 2019/0272248 A1* | 9/2019 | Metzner | G06F 13/4022 |
| 2019/0288870 A1* | 9/2019 | de Haas | H04L 12/40032 |
| 2021/0120017 A1* | 4/2021 | Antonsson | G06F 21/604 |

FOREIGN PATENT DOCUMENTS

| | | | |
|---|---|---|---|
| CN | 105247588 A | | 1/2016 |
| CN | 105409175 A | | 3/2016 |
| CN | 106302063 A | | 1/2017 |
| DE | 102015222334 A1 | | 5/2017 |
| EP | 1202451 A2 | | 5/2002 |
| JP | H03116214 A | | 5/1991 |
| JP | H06152610 A | * | 5/1994 |
| JP | H06152610 A | | 5/1994 |
| JP | 2009296550 A | | 12/2009 |
| KR | 20090011807 A1 | * | 2/2009 |
| WO | 2015141146 A1 | | 9/2015 |
| WO | 2015185057 A1 | | 12/2015 |

\* cited by examiner

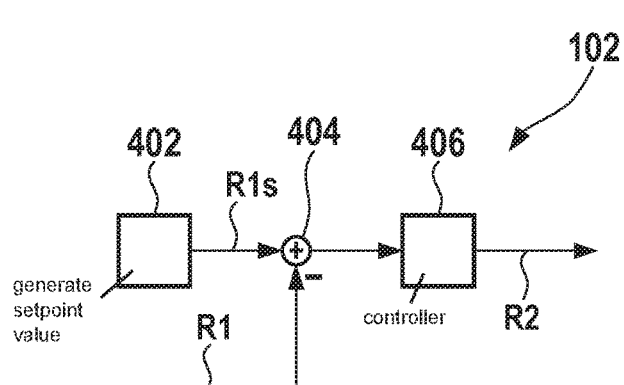
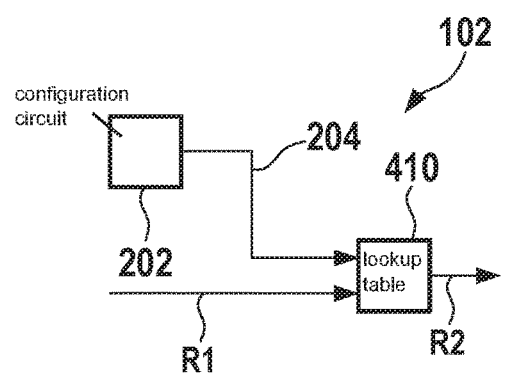
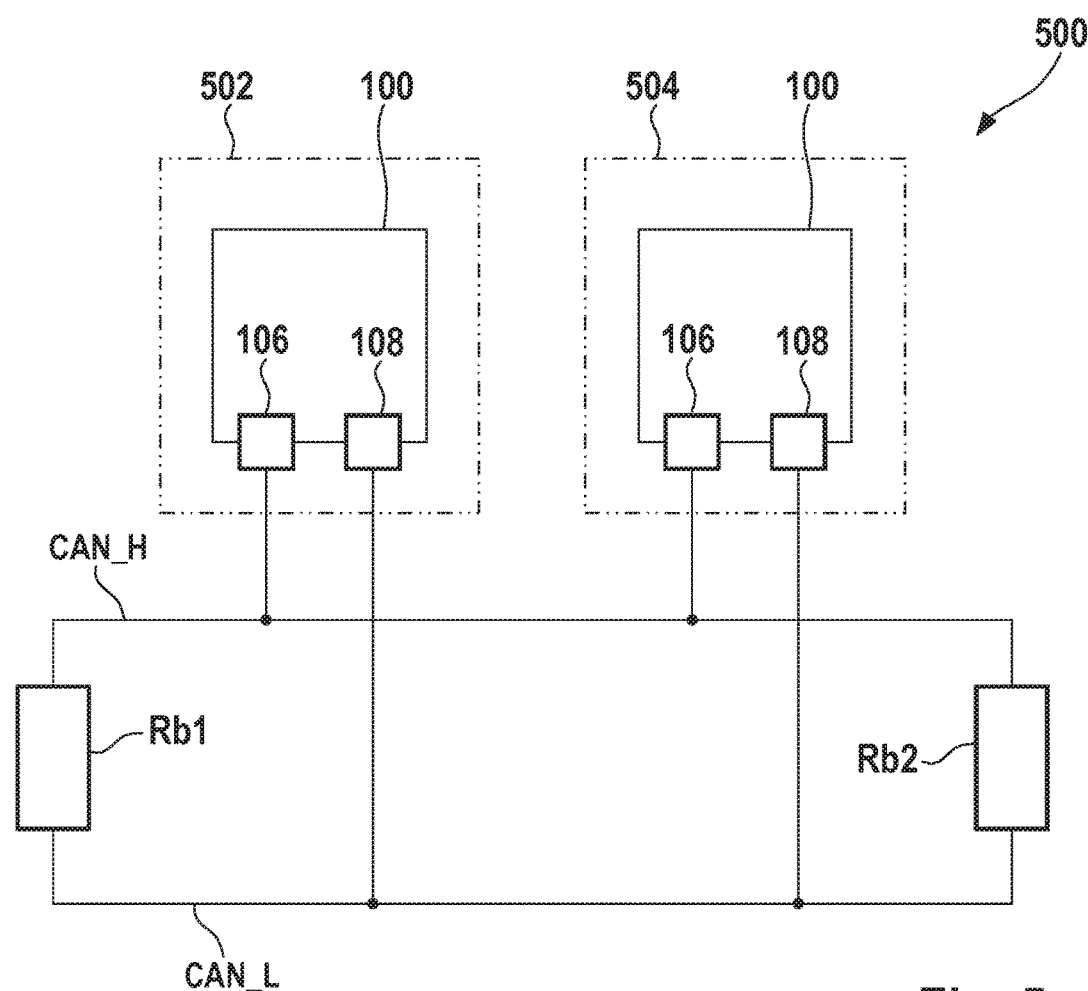

CIRCUIT FOR A BUS SYSTEM AND METHOD FOR OPERATING A CIRCUIT

FIELD

The present invention relates to a circuit for a bus system and a method for operating a circuit for a bus system.

BACKGROUND INFORMATION

Long-lasting oscillations of a bus voltage of a bus system due to improper scheduling or improper topology of the bus systems are significant factors which may result in error-prone data transfer. In particular shortening of the bit time due to increased transmission rates is problematic in this case.

To compensate for oscillations of the voltage, German Patent Application No. DE 10 2015 222 334 A1 describes that bus oscillations are selectively suppressed upon data reception. A masking element is provided for masking oscillations of the bus signal for a predetermined masking time if a monitoring result shows that oscillations, a difference of the bus signal after a transition of the bus signal from a dominant to a recessive state, exceed at least one predetermined threshold value.

SUMMARY

The problems of the related art may be addressed by a circuit and a method in accordance with example embodiments of the present invention. Advantageous refinements and exemplary embodiments of the present invention are described herein.

According to a first aspect of the present invention, a circuit for a bus system is provided. In accordance with an example embodiment of the present invention, the circuit includes: A measuring circuit, which is configured to measure a first resistance value between two bus-side terminals of the circuit; an ascertainment circuit, which is configured to ascertain a second resistance value as a function of the first resistance value; and a resistive circuit, which is configured to set a resistor connectable between the two bus-side terminals to the second resistance value. The setting of the resistor to the second resistance value is advantageously achieved in that the first resistance value, which was measured at the bus-side terminals, is in a range—presuming the activation of the resistor of the resistive circuit using the second resistance value—in which the communication via the bus system is maintained. In particular, due to the adaptation of the resistance value of the resistor, the first resistance value does not fall below a minimum value of, for example, 50 ohms.

One advantageous specific embodiment of the present invention includes that the ascertainment circuit is configured to increase the second resistance value if the first resistance value decreases. The first resistance value is advantageously stabilized by this increase of the second resistance value, which improves the robustness of the communication via the bus system.

One advantageous specific embodiment of the present invention includes that the measuring circuit is configured to ascertain at least one time window as a function of a message received via the two bus-side terminals and as a function of an a priori known position with respect to the received message, the resistive circuit being configured to set the resistor connected between the two bus-side terminals during the ascertained time window to the last determined second resistance value, and the measuring circuit being configured to wait out a waiting period after a beginning of the time window and following the waiting period and still before the end of the time window, to measure the first resistance value between the two bus-side terminals during a measurement period. Negative effects on the communication are advantageously prevented by the a priori known position in the message.

One advantageous specific embodiment of the present invention includes that the length of the waiting period and/or the measurement period is one bit time or shorter. In a correctly configured bus system, it may be presumed that the signal propagation time is shorter than the bit time. Negative effects on the measurement of the first resistance due to higher signal propagation times in the bus system are advantageously reduced by the minimum specification of the bit time for the measurement period and the waiting period.

One advantageous specific embodiment of the present invention includes that the resistive circuit is configured to ascertain the time window for the connection of the resistor and to connect the resistor during the time window using the last ascertained second resistance value, and the measuring circuit being configured to ascertain the first resistance during the time window. Measurement is advantageously carried out during the actual oscillation damping, whereby the second resistance value is ascertained as a function of the actual operation or the actual connection for the oscillation damping. The second resistance value may thus be adapted more accurately to the desired damping effect.

One advantageous specific embodiment of the present invention includes that the ascertainment circuit is configured to ascertain the second resistance value as a function of a comparison of the first resistance value to a setpoint value for the first resistance value. A control loop is advantageously provided, which ensures that the bus system independently finds a value for the total resistance to carry out a ringing suppression.

One advantageous specific embodiment of the present invention includes that that the ascertainment circuit is configured to ascertain the second resistance value with the aid of a lookup table as a function of the first resistance value. Finding the matching second resistance value is achieved in a simple way by the lookup table.

One advantageous specific embodiment of the present invention includes that the circuit includes: A configuration circuit, which is configured to provide a number of user stations of the bus system; and the ascertainment circuit, which is configured to ascertain the second resistance value with the aid of the lookup table as a function of the first resistance value and as a function of the provided number of user stations. An adaptation of the second resistance value to the actual bus configuration takes place due to the consideration of the number of user stations. In particular, in this way critical operating states are avoided, which avoids a strong drop of the first resistance value, in particular below the limit of 50 ohms.

A further aspect of the present invention relates to a transceiver for a user station of a bus system, the transceiver encompassing the circuit according to the first aspect of the present invention.

A further aspect of the present invention relates to a method for operating a circuit for a bus system, the method including: Measuring a first resistance value between two bus-side terminals of the circuit; ascertaining a second resistance value as a function of the first resistance value; and setting a resistor connectable between the two bus-side terminals to the second resistance value.

BRIEF DESCRIPTION OF THE DRAWINGS

FIGS. 4a, 4b each show a schematic block diagram in accordance with the present invention.

FIG. 5 shows an exemplary bus system in schematic form in accordance with the present invention.

DETAILED DESCRIPTION OF EXAMPLE EMBODIMENTS

Figure 1:
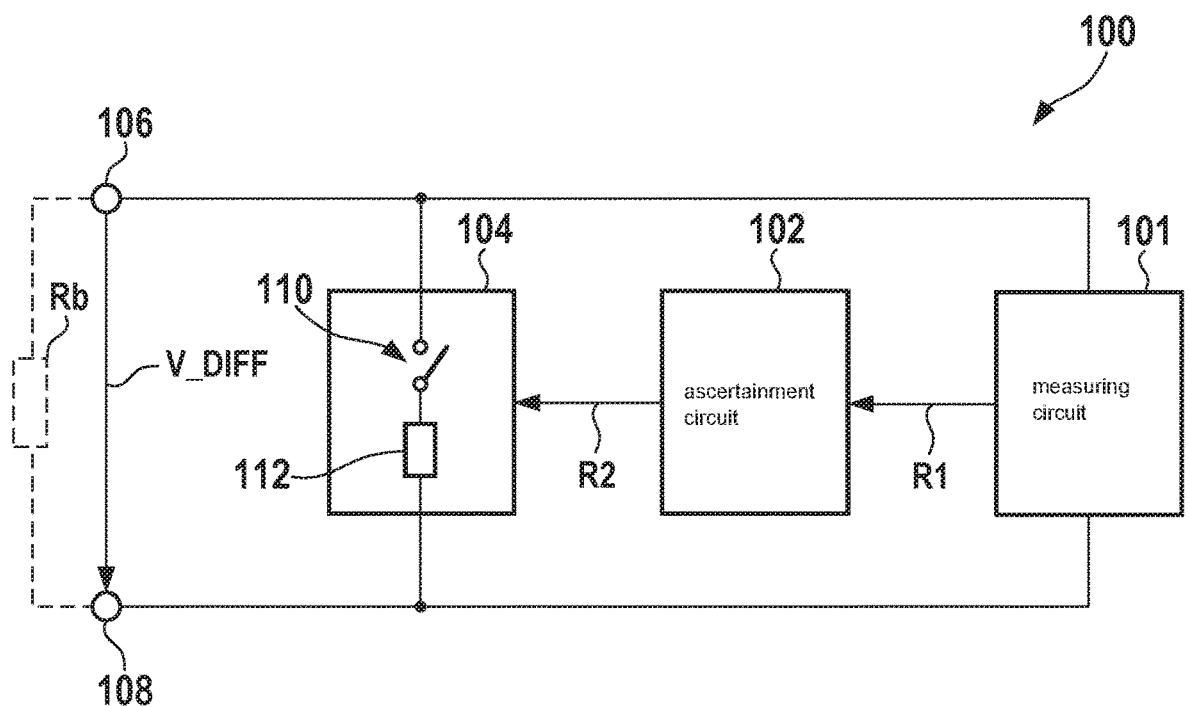
FIGS. 1, 2a, 2b each show a circuit in schematic form in accordance with the present invention.

FIG. 1 shows a circuit 100 for a bus system in accordance with an example embodiment of the present invention. Circuit 100 includes a measuring circuit 101, an ascertainment circuit 102, and a resistive circuit 104, measuring circuit 101 and resistive circuit 104 being situated in parallel to one another between two bus-side terminals 106 and 108 of circuit 100. Circuit 100 is connected to a first bus line CAN H via a terminal 106. Circuit 100 is connected to a second bus line CAN L via terminal 108. A voltage V DIFF drops between the two terminals 106 and 108.

Measuring circuit 101, ascertainment circuit 102, and resistive circuit 104 are designed, for example, as an ASIC, FPGA, or as a discrete circuit. Furthermore, measuring circuit 101, ascertainment circuit 102, and resistive circuit 104 include, for example, a processor, which is equipped with software to carry out the particular functions defined by software. Of course, mixed forms including a physical circuit and the processor on which the software is executed are also possible. The software is stored on a corresponding memory element. Circuit 100 is, for example, part of a transceiver for a user station of a bus system. In another specific embodiment, circuit 100 is designed in addition to an existing transceiver.

Shown in schematic form, resistive circuit 104 includes a switch 110 and a resistor 112 situated in series thereto. Of course, resistive circuit 104 may also be designed differently and may include, for example, a MOSFET. Resistor 112 is connected, for example, between the two bus-side terminals 106, 108 if a state transition takes place from a first state (for example, dominant) of an absolute value of voltage V DIFF to a second state (for example, recessive), for example, within an ascertained time window. Resistive circuit 104 is used to suppress or damp oscillations of voltage V DIFF.

Measuring circuit 101 ascertains a first resistance value R1 between the two bus-side terminals 106 and 108. The ascertainment of first resistance value R1 takes place, for example, at regular intervals. Thus, the ascertainment may be carried out, for example, in each data frame or only once per minute. This first resistance value R1 reflects the total resistance connected between the two terminals 106 and 108, which results, for example, due to the parallel connection of a bus resistance Rb and resistor 112. Ascertainment circuit 102 ascertains a second resistance value R2 for resistor 112 of resistive circuit 104 as a function of supplied first resistance value R1. Upon the start of the circuit, a predefined value is used for second resistance value R2. Second resistance value R2 is applied to resistive circuit 104 to set resistor 112 to second resistance value R2. Resistive circuit 104 connects resistor 112 between the two terminals 106 and 108 either on request from the outside or independently, resistor 112 being set to last ascertained resistance value R2.

Figure 2A:
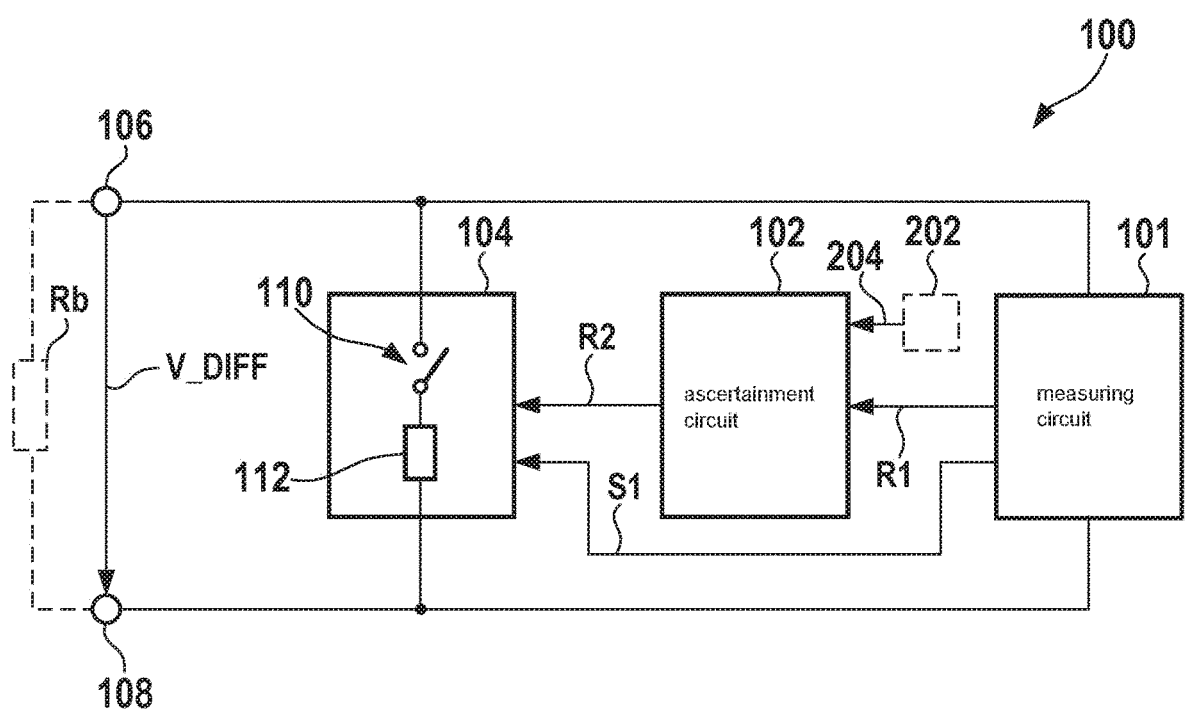

FIG. 2a shows circuit 100, measuring circuit 101 activating resistive circuit 104 with the aid of a signal S1, so that in the measurement subsequently carried out, the resistor connected between the two terminals 106, 108 is also measured. Measuring circuit 101 ascertains at least one time window as a function of a message which is received via the bus or which is transmitted on the bus, and as a function of a previously known position in relation to the message. For this purpose, knowledge about the protocol is used, in particular the presence of a message and its position with respect to time are ascertained as a function of voltage V DIFF. Resistive circuit 104 is operated with the aid of signal S1 in such a way that during the ascertained period, second resistance value R2 is set for the resistor connected between terminals 106, 108. After the resistor is interconnected, a waiting period is waited out and subsequently the first resistance value is measured with the aid of measuring circuit 101 during a measurement period. During the measurement period, a profile of the first resistance value is ascertained and the minimum of the profile is output as the first resistance value. Both the waiting period and the measurement period are, for example, one nominal bit time long, because the nominal bit time is made up of approximately 70% of a round-trip time which necessarily has to be waited out. In another example, the waiting period and also the measurement period are shorter than the nominal bit time.

A configuration circuit 202 provides a number 204 of user stations of the bus system. Number 204 may either be preconfigured or the configuration circuit independently ascertains number 204 of user stations. For the independent ascertainment of number 204, configuration circuit 202 exchanges messages with other bus users. Ascertainment circuit 102 may, for example, define second resistance value R2 to be shorter for an increased number 204 than if a reduced number 204 is present.

Figure 2B:
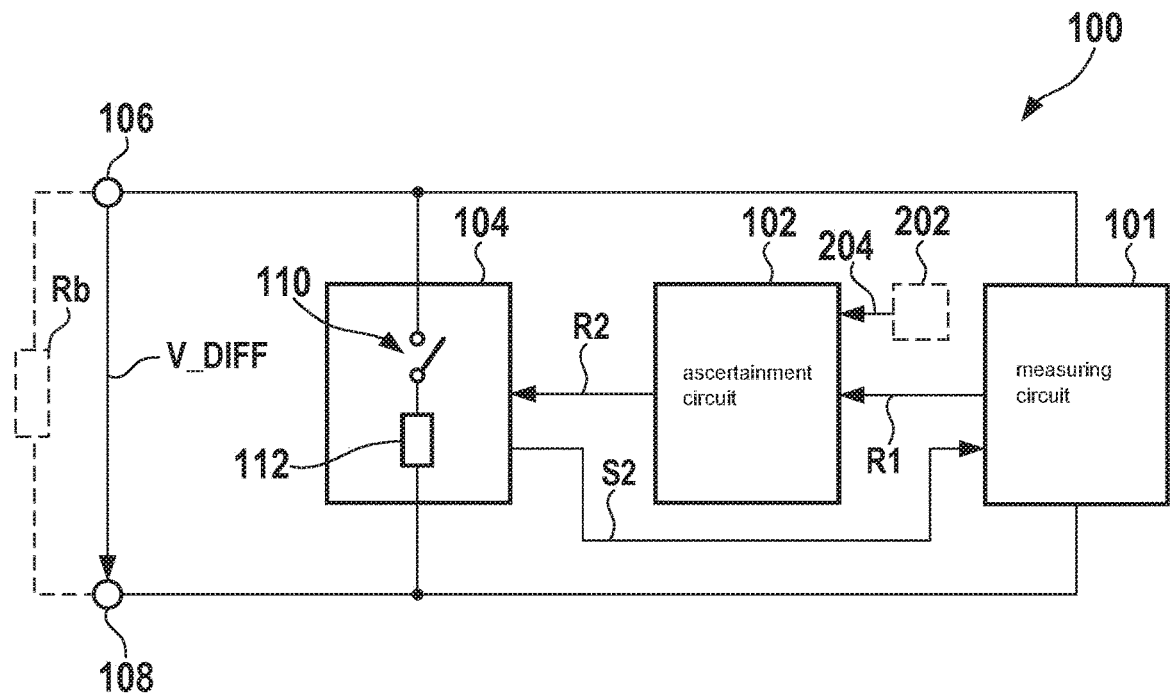

FIG. 2b shows circuit 100. In contrast to FIG. 2a, a signal S2 is transmitted from resistive circuit 104 to measuring circuit 101. Resistive circuit 104 independently ascertains the time window for connection of the resistor. The ascertainment of the time window may be considered to be a basic function for operating the resistive circuit. Via signal S2, measuring circuit 101 is signaled that the resistor is connected; the time window is thus transferred to measuring circuit 101. As long as signal S2 signals the connection of the resistor, the measuring circuit carries out a measurement of the first resistance.

Figure 3:
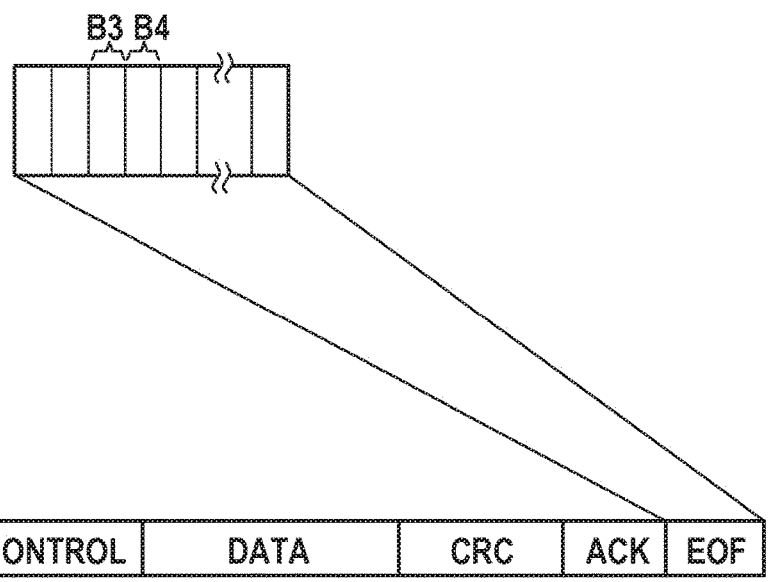
FIG. 3 shows a schematic protocol diagram in accordance with the present invention.

FIG. 3 shows a structure of a CAN message and the temporal arrangement of the measurement of the first resistance value. The message shown includes the following fields: start of frame (SOF), message identifier (MID), remote transmission request (RTR), control field (CONTROL), data field (DATA), CRC field (CRC), acknowledge field (ACK), end of frame (EOF). For example, at the beginning of third bit B3, the resistor of resistive circuit 104 is connected to carry out the measurement of the first resistance value in subsequent fourth bit B4. Alternatively or additionally, the connection of the resistor of the resistive circuit and the measurement of the first resistance value take place within the intermission field, which is located between end of frame EOF and start of frame SOF. Third and fourth bit B3, B4 and the intermission field are particularly well suitable due to the recessive bus level for connection of the resistor of resistive circuit 104.

FIG. 4a shows ascertainment circuit 102 in a schematic detail. A block 402 generates a setpoint value R1s and supplies it to an addition point 404. Measured first resistance value R1 is subtracted at addition point 404 from setpoint value R1s to ascertain actuating variable d. A controller 406 ascertains second resistance value R2, which functions in the present case as a control variable, as a function of actuating variable d. Controller 406 may be, for example, a PID controller or a differently designed controller.

FIG. 4b shows ascertainment circuit 102 in a schematic detail. Configuration circuit 202 provides number 204 of bus users to a block 410. Block 410 encompasses a lookup table, which ascertains second resistance value R2 as a function of number 204 and as a function of first resistance value R1. The lookup table is stored in a memory element. A still simpler variant is also possible in which resistance R2 is ascertained with the aid of block 410, which contains a lookup table, as a function of resistance R1.

FIG. 5 shows a bus system configured by way of example including two user stations 502, 504. Each of user stations 502, 504 encompasses particular circuit 100, which is connected using first terminal 106 to first bus line CAN H and using second terminal 108 to second bus line CAN L. Bus lines CAN H and CAN L are connected to one another at their ends via a particular terminating resistor Rb1 and Rb2. By connecting and disconnecting the resistor between bus-side terminals 106, 108, particular circuits 100 of user stations 502 and 504 cause oscillations in the event of a state change from dominant to recessive to be damped and thus reduced. Bus system 500 operates according to the exemplary embodiments according to the CAN standard, for example, ISO 11898. Circuit 100 and the operation of the circuit may also readily be transferred to other bus systems, however. In addition, other bus topologies are also possible.

What is claimed is:

1. A circuit for a bus system, comprising:
a measuring circuit configured to measure a first resistance value between two bus-side terminals of the circuit;
an ascertainment circuit configured to ascertain a second resistance value as a function of the first resistance value; and
a resistive circuit configured to set a resistor connectable between the two bus-side terminals to the second resistance value, wherein the measuring circuit is configured to ascertain at least one time window as a function of a message received via the two bus-side terminals and as a function of an a priori known position in relation to the received message, the resistive circuit being configured to set the resistor connected between the two bus-side terminals to a last ascertained second resistance value during the ascertained time window, and the measuring circuit is configured to wait out a waiting period after a beginning of the time window and subsequently to the waiting period and, still before the end of the time window, to measure the first resistance value between the two bus-side terminals during a measurement period.

2. The circuit as recited in claim 1, wherein the length of the waiting period and/or the measurement period is one bit time or shorter.

3. The circuit as recited in claim 1, wherein the resistive circuit is configured to ascertain the time window for connecting the resistor, and to connect the resistor during the time window using the last ascertained second resistance value, and the measuring circuit is configured to ascertain the first resistance value during the time window.

4. A circuit for a bus system, comprising:
a measuring circuit configured to measure a first resistance value between two bus-side terminals of the circuit;
an ascertainment circuit configured to ascertain a second resistance value as a function of the first resistance value; and
a resistive circuit configured to set a resistor connectable between the two bus-side terminals to the second resistance value, wherein the ascertainment circuit is configured to ascertain the second resistance value using a lookup table as a function of the first resistance value.

5. The circuit as recited in claim 4, wherein the circuit further comprises:
a configuration circuit configured to provide a number of user stations of the bus system;
wherein the ascertainment circuit is configured to ascertain the second resistance value using the lookup table as a function of the first resistance value and as a function of the provided number of user stations.

* * * * *